(12) United States Patent
Matsuki et al.

(10) Patent No.: US 7,233,076 B2
(45) Date of Patent: Jun. 19, 2007

(54) SEMICONDUCTOR DEVICE WITH READ OUT PREVENTION AND METHOD OF PRODUCING SAME

(75) Inventors: Hirohisa Matsuki, Kawasaki (JP); Masamitsu Ikumo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 351 days.

(21) Appl. No.: 10/924,206

(22) Filed: Aug. 24, 2004

(65) Prior Publication Data
US 2005/0224970 A1    Oct. 13, 2005

(30) Foreign Application Priority Data
Apr. 1, 2004   (JP)   .............................. 2004-109000

(51) Int. Cl.
*H01L 23/29* (2006.01)
(52) U.S. Cl. ..................... 257/795; 257/787; 257/922; 257/E23.069
(58) Field of Classification Search ...................... None
See application file for complete search history.

(56) References Cited

U.S. PATENT DOCUMENTS 4,860,351 A * 8/1989 Weingart .................... 713/194
6,280,858 B1 * 8/2001 Teshima .................... 428/639
6,864,574 B1 * 3/2005 Nobori et al. .............. 257/720
2002/0040923 A1 * 4/2002 Schredl et al. ........... 228/248.1
2002/0058412 A1 * 5/2002 Ono et al. .................. 438/678

FOREIGN PATENT DOCUMENTS

| JP | 2000/021939 A | 1/2000 |
| JP | 2003-142539 | 5/2003 |
| WO | WO 01/60938 A1 | 8/2001 |

OTHER PUBLICATIONS

Korean Office Action dated Jan. 25, 2006, issued in corresponding Korean application.

* cited by examiner

*Primary Examiner*—Leonardo Andujar
*Assistant Examiner*—Kevin Quinto
(74) *Attorney, Agent, or Firm*—Westerman, Hattori, Daniels & Adrian, LLP.

(57) ABSTRACT

A semiconductor device has antenna pads and a testing pad formed on the substrate. An insulating resin layer containing a filler covers the testing pad, and bumps are provided on the antenna pads. Specific data in the semiconductor device are inhibited from being read out or rewritten, by the provision of the insulating resin layer containing a filler.

9 Claims, 7 Drawing Sheets

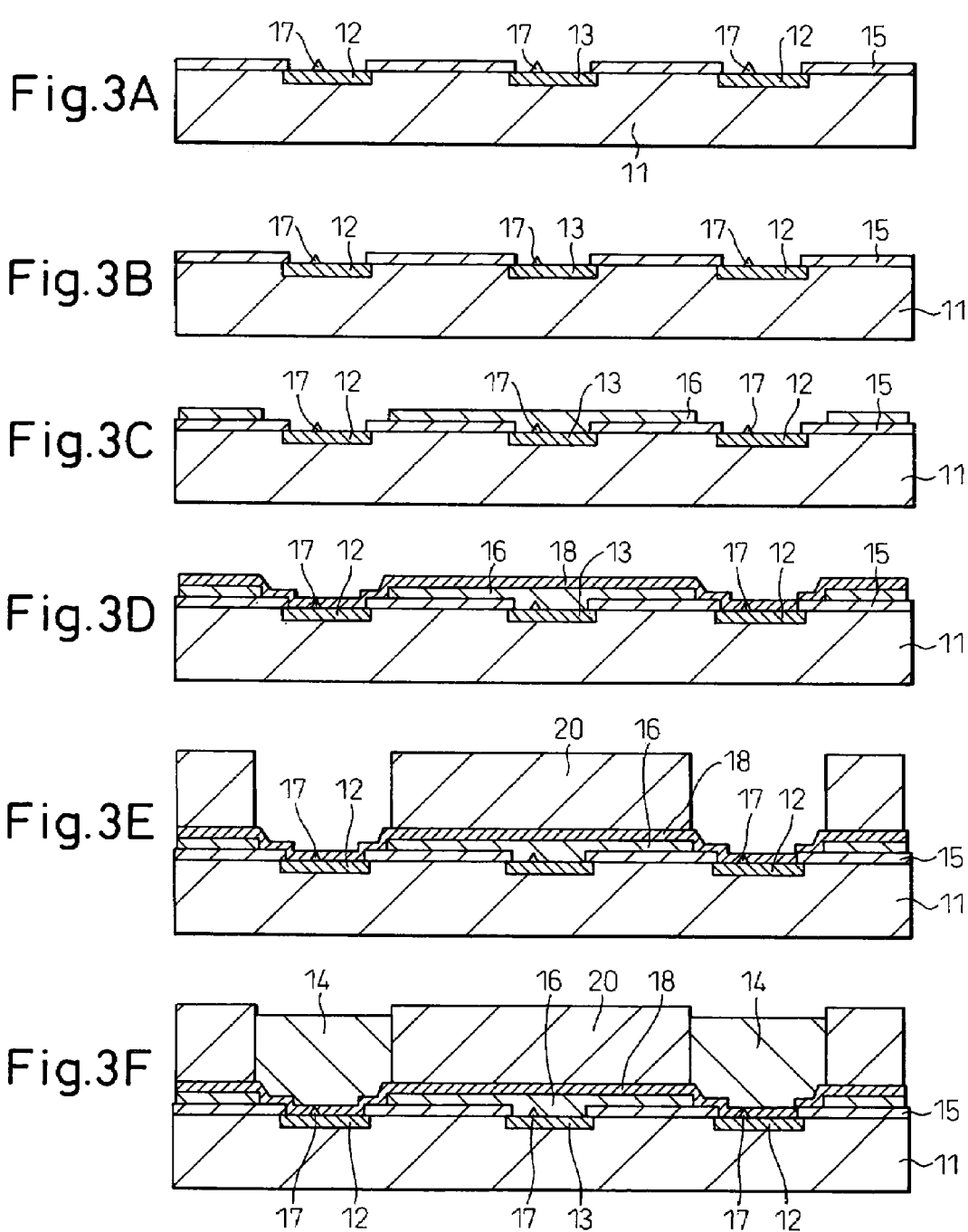

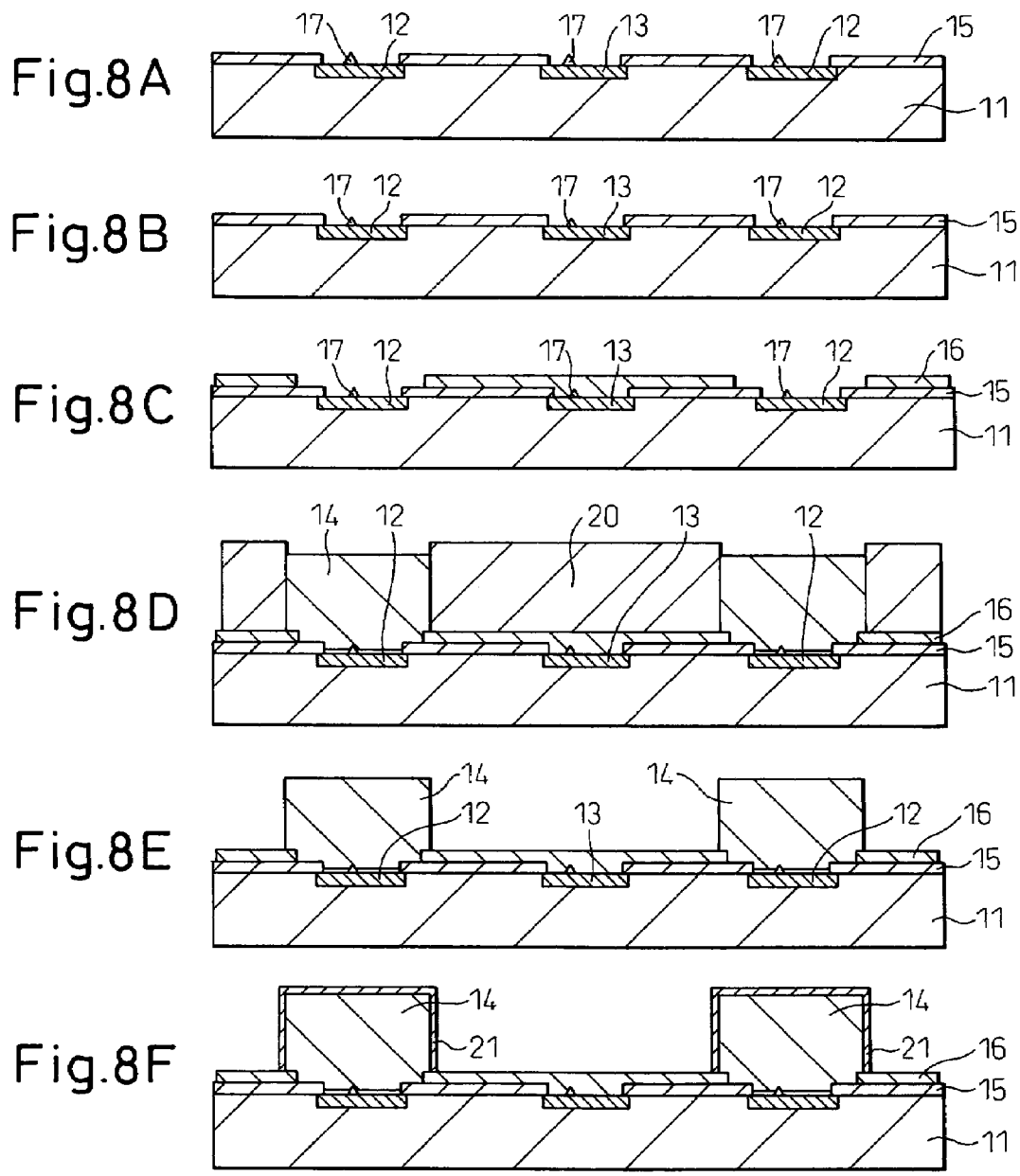

SEMICONDUCTOR DEVICE WITH READ OUT PREVENTION AND METHOD OF PRODUCING SAME

BACKGROUND OF THE INVENTION

1. Field of the Invention

The present invention relates to a semiconductor device and a method of producing the semiconductor device. In particular, the present invention relates to an electrode structure of a semiconductor device formed as a nonvolatile memory, and to a structure for preventing an operation of intentionally reading out the internal data and a method for its production.

2. Description of the Related Art

In recent years, IC cards and, particularly, IC tags mounting a semiconductor device formed as a nonvolatile memory have been widely produced and used. In such semiconductor devices, part of the internal data is written as specific data in such a manner that data cannot be written and read out, and data are suitably written into a writable memory portion.

A nonvolatile memory IC for an IC tag includes antenna pads and a testing pad. FIG. 10 illustrates a conventional nonvolatile memory IC for an IC tag. The IC includes antenna pads 2 and a testing pad 3, formed on a substrate 1, and Au stud bumps 4 are formed on the antenna pads 2. The testing pad 3 is exposed for testing (for writing data). Reference numeral 5 denotes an inorganic insulating film and 6 denotes an organic insulating film.

In the above IC, a test is conducted after the antenna pads 2 and the testing pad 3 are formed, by bringing a testing probe into contact with the antenna pads 2 and with the testing pads 3. A needle scar 7 is formed on the antenna pads 2 and the testing pads 3 at portions where the probe comes into contact.

In the IC tags, the internal specific data, in most cases, must be kept secret and may be a history of the products and personal data. If the internal specific data can be read out or can be rewritten, it is possible that the data can be incorrectly used, which is not desirable.

For example, Japanese Unexamined Patent Publication (Kokai) No. 2003-142539 (pp. 4-6, FIG. 3) discloses a semiconductor device and a method of testing a semiconductor device. According to this testing method, a probe is brought onto a desired terminal without problem even if the surface of the substrate is rough to some extent. As illustrated in FIG. 10, therefore, the data can be read out by bringing the probe into contact with the testing pad 3 even when there is a protrusion such as a stud bump 4 on the surface of the substrate and a difference in height between the stud bump 4 and the testing pad 3. Therefore, the internal specific data may be incorrectly used.

Further, the Au stud bump 4 is expensive to fabricate, and it is desired to fabricate the bumps at a low cost. It is therefore desired to employ a method, of forming the bumps, relying upon electrolytic plating or non-electrolytic plating.

Also, in the fabrication process, the bump is formed on the antenna pad after the steps in which the data are written and the probe is brought in contact with the testing pad. When the bump is formed by electrolytic plating, a seed layer for UBM plating (UBM; under bump metal or under barrier metal) is formed and, then, a metal is plated thereon to form a bump on the antenna pad. If the seed layer (UBM; under bump metal or under barrier metal) is formed on the pads 2 and 3 where the needle scars 7 of the probe remain in a protruded manner, then, the protruded portions of the pads are not covered with the underlying layer to a sufficient degree. Namely, the plated bump metal and the pad metal come into direct contact with each other, a diffusion reaction takes place during use, and the bump strength becomes drops.

Also, in the method of forming bumps relying on the non-electrolytic Ni plating, hydrogen, which is produced during the non-electrolytic Ni plating, penetrates a passivation film and enters into the ferroelectric layer and it becomes probable that the pinning phenomenon occurs to make it difficult to rewrite the data.

SUMMARY OF THE INVENTION

It is an object of the present invention to provide a semiconductor device which inhibits specific data, inside the device, from being read out and inhibits the data from being written again and a method of producing the semiconductor device.

A semiconductor device, according to the present invention, comprises a substrate, antenna pads formed on the substrate, a testing pad formed on the substrate, an insulating resin layer containing a filler covering the testing pad, and bumps provided on the antenna pads.

In this constitution, the testing pad, other than the antenna pads, is covered with the insulating resin containing the filler. Therefore, even if an unauthorized person attempts to bring the probe into contact with the testing pad, the probe is not easily brought into contact with the testing pad through the insulating resin containing the filler. Besides, even if it is attempted to remove the insulating resin by etching, the presence of the filler makes etching impossible.

A method of producing a semiconductor device, according to the present invention, comprises the steps of forming antenna pads and a testing pad on a substrate, covering a part of the substrate except for the antenna pads with an insulating resin layer containing a filler, forming a seed layer for plating on the antenna pads and the insulating resin layer containing the filler, and plating the seed layer for plating to form bumps on the antenna pads.

In this constitution, the probe is not allowed to be easily brought into contact with the testing pad through the insulating resin containing the filler. Besides, with the surface of the testing pad being smoothed prior to covering the testing pad other than the antenna pads with the insulating resin layer containing the filler, the scar made by the probe becomes smooth in the step of testing. Further, the protrusion of the testing pad becomes smooth in forming the bump by the electrolytic plating in a subsequent step. Therefore, the testing pad is well covered with the UBM layer, and the bump is formed reliably.

A method of producing a semiconductor device, according to the present invention, comprises the steps of forming antenna pads and a testing pad on a substrate, covering a part of the substrate except for the antenna pads and the testing pad with an insulating resin layer containing a filler, forming a seed layer for plating on the antenna pads, the testing pad and the insulating resin layer containing a filler, plating the seed layer for plating to form bumps on the antenna pads, and removing the seed layer for plating and the testing pad except for the antenna pads.

Further, a method of producing a semiconductor device, according to the present invention, comprises the steps of forming antenna pads and a testing pad on a substrate, covering a part of the substrate except for the antenna pads with an insulating resin layer containing a filler, forming bumps on the antenna pads by non-electrolytic plating, and covering the surface of the bumps with a solder layer.

In this constitution, a predetermined testing step is effected. Then, after the bumps are formed, the testing pad is removed except for the antenna pads. With the testing pad being removed, the probe can no longer be brought into contact with the testing pad, and the data in the semiconductor device cannot be read out. In this case too, the testing pad is pretreated prior to the step of forming the bumps so that the needle scar is smoothed and, then, the bumps are formed by electrolytic plating.

A semiconductor device, according to the present invention, comprises a substrate, antenna pads formed on the substrate, a testing pad formed on the substrate, and bumps provided on the antenna pads, the bump being mainly made of copper formed by non-electrolytic plating.

In the non-electrolytic plating using copper, hydrogen hardly evolves. Therefore, as hydrogen does not penetrate the passivation film and enter the ferroelectric layer, the pinning phenomenon does not take place. This makes it possible to form a highly reliable semiconductor device at a low cost.

BRIEF DESCRIPTION OF THE DRAWINGS

FIGS. 3A to 3F are views illustrating a method of producing the semiconductor device of FIG. 1;

FIGS. 8A to 8F are views illustrating a method of producing the semiconductor device of FIG. 7;

DESCRIPTION OF THE PREFERRED EMBODIMENTS

The preferred embodiments of the present invention will now be described with reference to the drawings.

Figure 1:
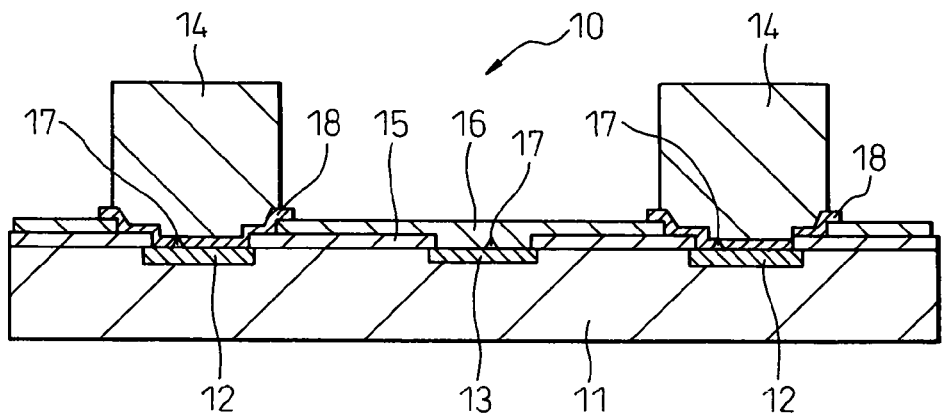
FIG. 1 is a sectional view illustrating a semiconductor device according to an embodiment of the present invention.
Figure 2A:
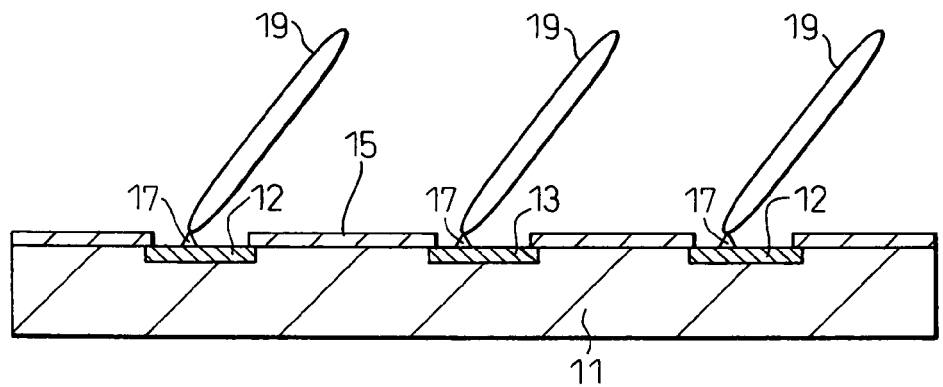
FIGS. 2A and 2B are sectional views illustrating a state where a probe is brought into contact with the semiconductor device of FIG. 1.
Figure 2B:
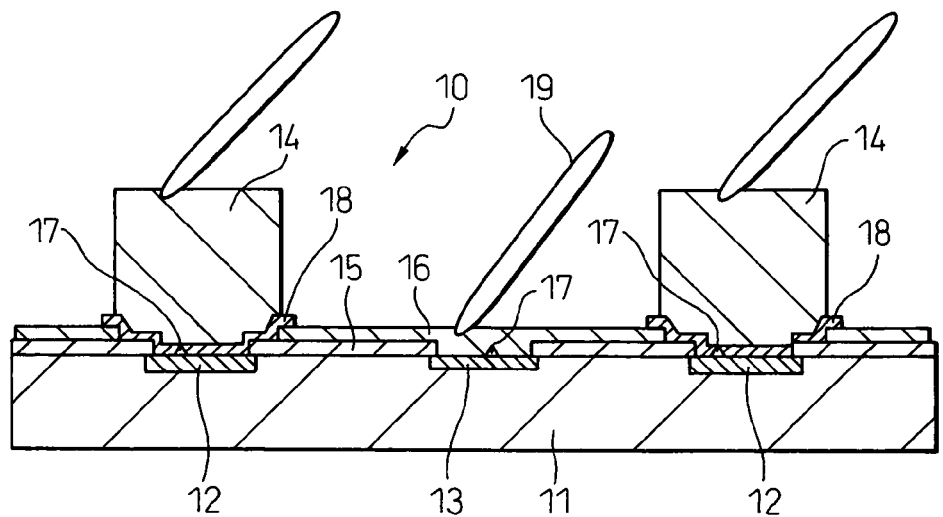

FIG. 1 is a view illustrating a semiconductor device according to a first embodiment of the present invention, and FIGS. 2A and 2B are views illustrating a state where a probe is brought into contact with the semiconductor device of FIG. 1. The semiconductor device 10 is formed as a nonvolatile memory IC for an IC tag. The semiconductor device 10 includes antenna pads 12 and a testing pad 13, formed on a substrate (semiconductor wafer, semiconductor chip, etc.) 11, and bumps 14 are formed on the antenna pads 12. A semiconductor circuit is formed on the substrate 11 by a semiconductor process, and the antenna pads 12 and the testing pad 13 are connected to the semiconductor circuit.

In FIGS. 1 to 2B, reference numeral 15 denotes an inorganic insulating film, and 16 denotes an insulating resin layer containing a filler. Reference numeral 17 denotes a needle scar and 18 denotes a seed layer for electrolytic plating (UBM: under bump metal or under barrier metal).

The inorganic insulating film 15 has openings for exposing the antenna pads 12 and the testing pad 13. The insulating resin layer 16 containing the filler has openings for exposing the antenna pads 12 but covers the testing pad 13.

Referring to FIG. 2A, after the antenna pads 12, the testing pad 13 and the inorganic insulating film 15 are formed, and before the insulating resin layer 16 containing the filler and the pumps 14 are formed, a test is effected or data are written, by bringing a testing probe 19 into contact with the antenna pads 12 and the testing pad 13. Needle scars 17 are formed on the antenna pads 12 and the testing pad 13 at portions where the probe 19 contacts. The needle scar 17 assumes a form that is partly protruded. After the test using the probe 19, the insulating resin layer 16 containing the filler and the bumps 14 are formed.

FIG. 2B is a view illustrating a state where the probe 19 is brought into contact with the semiconductor device after the insulating resin layer 16 containing the filler and the bump 14 are formed. In this case, an attempt is made to bring the probe 19 into contact with the testing pad 13 to have access to the data. However, as the testing pad 13 is covered with the insulating resin layer 16 containing the filler, the probe 19 cannot contact the testing pad 13 and access to the data is not possible.

In the IC tags or the like, the internal specific data are, in most cases, those which need high degree of secrecy, such as a history of the products and personal data. According to the present invention, the internal specific data cannot be read out or rewritten, and there is no possibility that the data are incorrectly used.

It is possible to prevent the probe 19 from coming into contact with the testing pad 13 if the testing pad 13 is covered with a resin layer without filler. When the resin layer without filler has a very small thickness, however, it is possible that the probe 19 will come into contact with the testing pad 13 by penetrating the resin layer without filler, despite the testing pad 13 being covered with the resin layer without filler. If the testing pad 13 is covered with the insulating resin layer 16 containing the filler, it is possible to surely prevent the probe 19 from coming into contact with the testing pad 13 by penetrating the insulating resin layer 16 containing the filler. Namely, even if the thickness of the insulating resin layer 16 containing the filler is very small, the filler works to increase the hardness of the insulating resin layer 16 containing the filler and prevents the probe 19 from penetrating the insulating resin layer 16 containing the filler. Further, even if it is attempted to remove the insulating resin layer 16 containing the filler by ashing or the like measure, it is difficult to remove the filler which remains.

Silica or acrylic resin can be used as the filler in the insulating resin layer 16. Silica or acrylic resin permits light to pass through and can, hence, be used even for the photosensitive resins. When the resin film is formed by printing or the like method, the filler may be metal or one that does not permit light to pass through. For example, a filler comprising silica particles having the size of 1 to 2 μm is mixed in an amount of 30 to 40% by weight into the resin. The insulating resin layer 16 containing the filler has a thickness of, for example, 3 to 6 μm.

It is desired that the resin used for the insulating resin layer 16 containing the filler is one that can be cured at, for example, not higher than 230° C. to prevent the data in the nonvolatile memory from being disturbed by heat. Examples of the resin material include silicone resin and epoxy resin. The insulating resin layer 16 containing the filler has a sufficient thickness to cover the needle scar 17. The substrate (semiconductor chip) 11, on the other hand, has a small thickness. Therefore, if the insulating resin layer 16 containing the filler has a large thickness, warping occurs. It is, therefore, desired that the insulating resin layer 16 containing the filler has a thickness which is as small as possible.

FIGS. 3A to 3F are views illustrating a method of producing the semiconductor device of FIG. 1. FIG. 3A illustrates a state where the substrate 11 is subjected to semiconductor processing to form the antenna pads 12 and the testing pad 13 and the test is carried out. A needle scar 17 may be formed. The inorganic insulating film 15 has openings to expose the antenna pads 12 and the testing pad 13.

FIG. 3B illustrates a state where a pretreatment is effected to smooth the surface of the testing pad 13 prior to covering the testing pad 13 except for the antenna pads 12 with the insulating resin layer 16 containing the filler. As a result, the needle scar 17 becomes small. The pretreatment is effected by etching such that the height of the needle scar 17 becomes smaller than 2.5 µm. Due to the treatment, the shape of the needle scar 17 is smoothed.

FIG. 3C illustrates a state where a part of the substrate 11 including the testing pad 13 and except for the antenna pads 12 is covered with the insulating resin layer 16 containing the filler. The insulating resin layer 16 containing the filler is selected, for example, from a photosensitive insulating resin and is formed to have a thickness of not smaller than about 4 µm. Silica or acrylic resin is used as the filler.

FIG. 3D is a view showing a state where an underlying layer 18 for electrolytic plating is formed on the surface of the substrate 11 having the insulating resin layer 16 containing the filler formed thereon by using a sputtering apparatus. The seed layer 18 is formed by using, for example, Ti. FIG. 3E is a view showing a state where a resist 20 of a predetermined pattern is formed on the underlying layer 18. FIG. 3F is a view showing a state where the bumps 14 are formed on the underlying layer 18 at portions thereof exposed through the openings in the resist 20 by effecting the electrolytic plating using the resist 20 as a mask. The bumps 14 comprise, for example, Au plating.

After the step of FIG. 3F, the resist 20 is removed, the underlying layer 18 is etched, and formation of the bumps is finished. This state is illustrated in FIG. 1.

Figure 4:
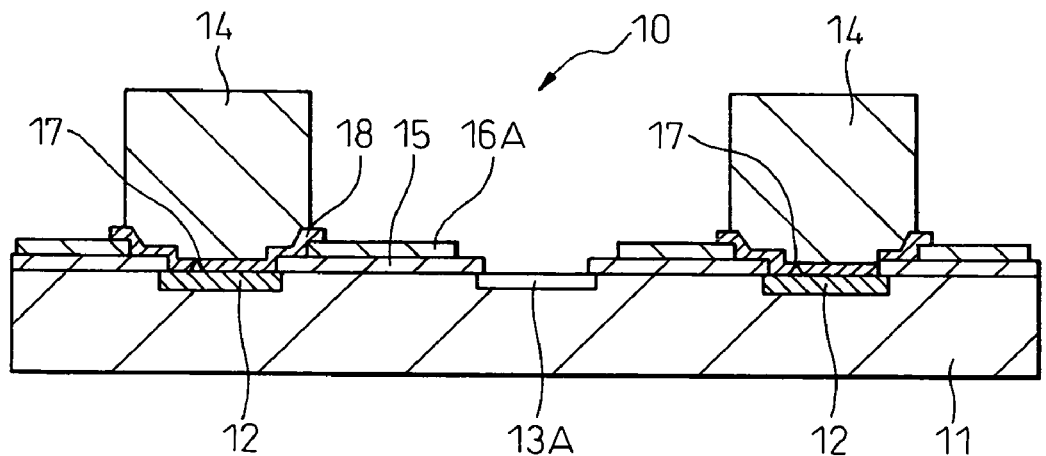
FIG. 4 is a sectional view illustrating a semiconductor device according to an embodiment of the present invention.

FIG. 4 is a view illustrating a semiconductor device according to a second embodiment of the present invention. The semiconductor device 10 of this embodiment resembles the semiconductor device 10 of FIG. 1. In this embodiment, however, the testing pad 13 of FIG. 1 is removed, and a cavity 13A is formed at a portion where the testing pad 13 has been provided. Further, an insulating resin layer 16A containing a filler is provided instead of the insulating resin layer 16 containing a filler. The insulating resin layer 16A containing the filler exposes the cavity 13A where the testing pad 13 has been provided.

Figure 5:
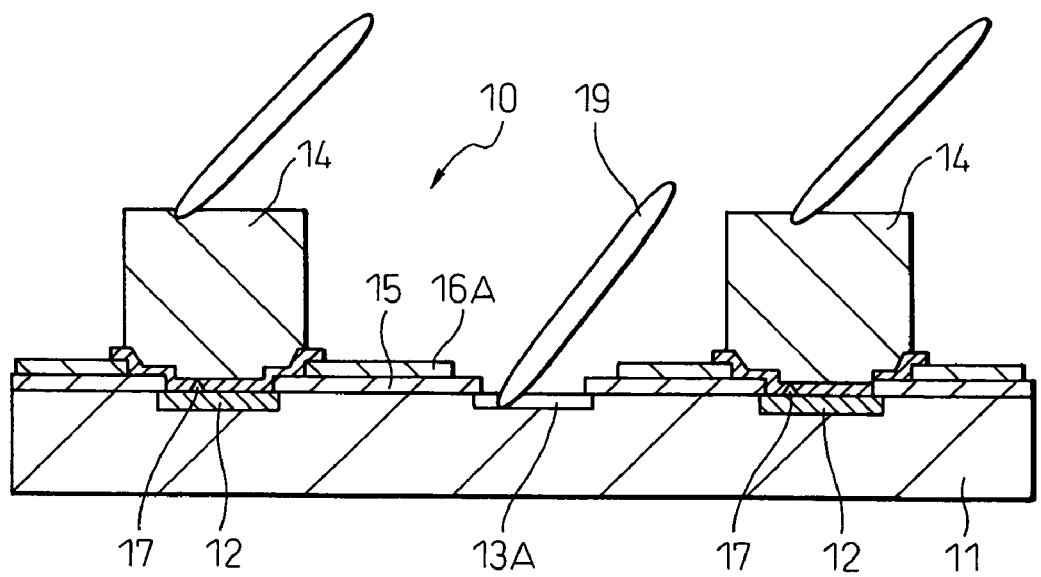
FIG. 5 is a sectional view illustrating a state where the probe is brought into contact with the semiconductor device of FIG. 4.

FIG. 5 is a view illustrating a state where the probe 19 is brought into contact with the semiconductor device of FIG. 4. In this case, it is attempted to bring the probe 19 into contact with the testing pad 13 to access the data. However, as there is no testing pad 13, the probe 19 cannot be brought into contact with the testing pad 13, and the data are not accessible.

Figure 6:
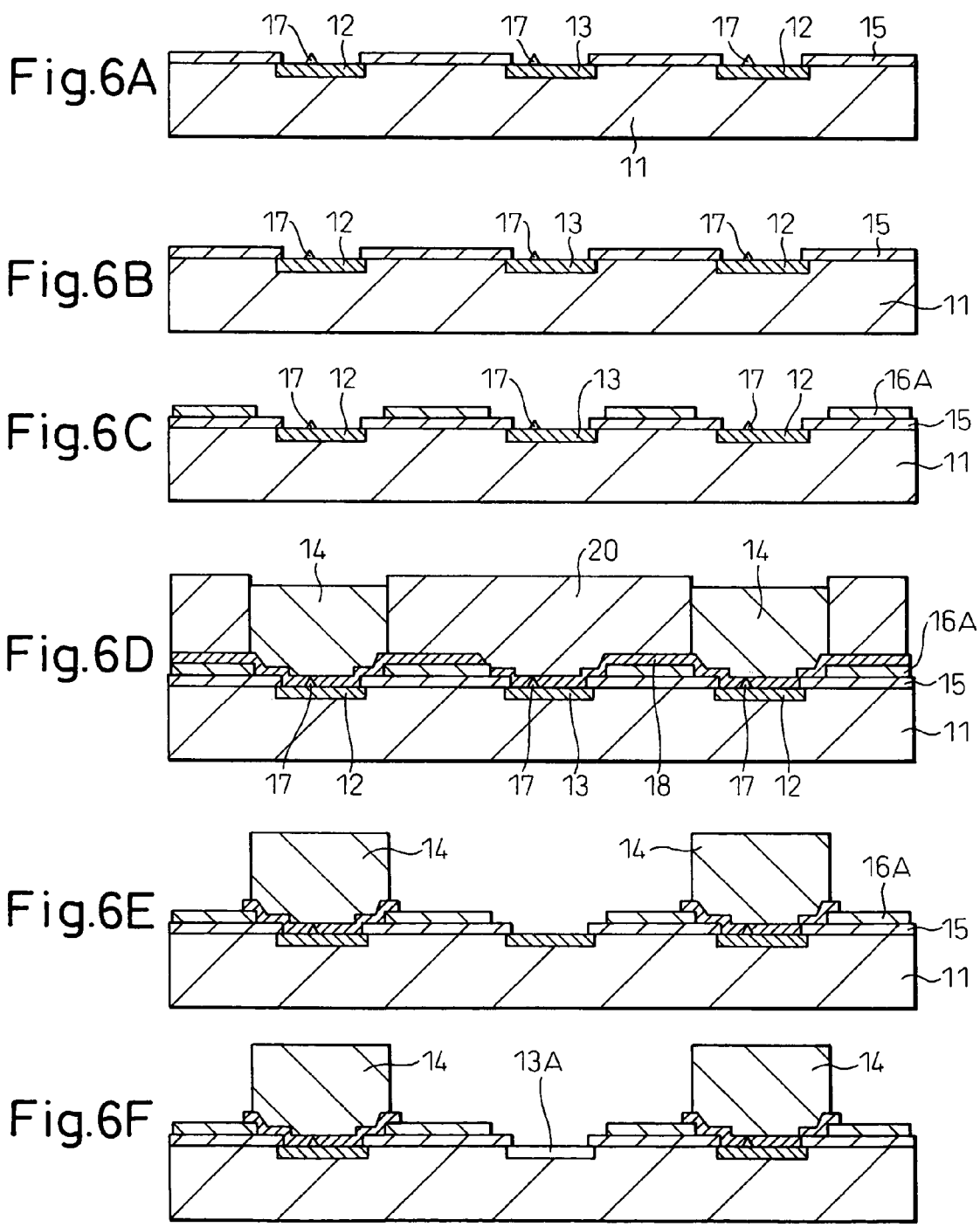
FIGS. 6A to 6F are views illustrating a method of producing the semiconductor device of FIG. 5.

FIGS. 6A to 6F are views illustrating a method of producing the semiconductor device of FIG. 4. FIG. 6A illustrates a state where the substrate 11 is subjected to a semiconductor process to form the antenna pads 12 and the testing pad 13 and the test is carried out. There is formed a needle scar 17. The inorganic insulating film 15 has openings to expose the antenna pads 12 and the testing pad 13.

FIG. 6B illustrates a state where a pretreatment is effected to smooth the surface of the testing pad 13. As a result, the needle scar 17 is reduced. FIG. 6C is a view illustrating the formation of the insulating resin layer 16A containing the filler. The insulating resin layer 16A containing the filler has openings for exposing the antenna pads 12 and the testing pad 13. It is possible to arrange that the insulating resin layer 16A does not contain a filler.

FIG. 6D is a view illustrating a state where the underlying layer 18 for electroplating is formed on the surface of the substrate 11 having the insulating resin layer 16A containing the filler formed thereon by using a sputtering apparatus. Further, a resist 20 of a predetermined pattern is formed on the underlying layer 18, the electroplating is effected using the resist 20 as a mask, and the bumps 14 are formed on the underlying layer 18 at portions thereof exposed through the openings in the resist 20. The bumps 14 are formed by using, for example, Au plating. FIG. 6E is a view illustrating a state where the resist 20 is removed, the underlying layer 18 is etched, and formation of the bumps is finished.

FIG. 6F is a view illustrating a state where the etching is further effected to remove the testing pad 13. Therefore, the insulating resin layer 16A containing the filler exposes the cavity 13A at a place where the testing pad 13 was provided. The testing pad 13 is made of Al. In this case, the testing pad 13 is removed while controlling the etching rate by using a phosphoric acid-type etchant, so that the inner layer wiring remains in the substrate 11.

Figure 7:
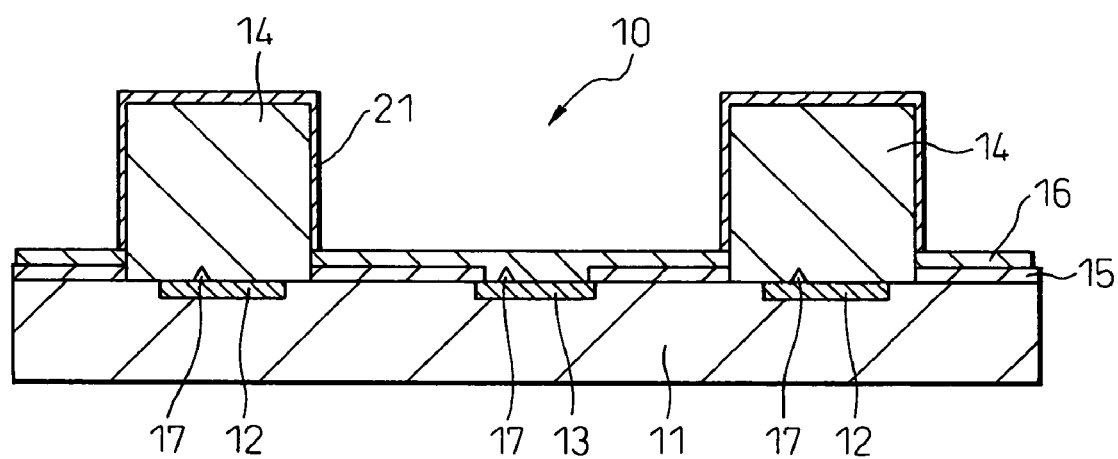
FIG. 7 is a sectional view illustrating a semiconductor device according to an embodiment of the present invention.

FIG. 7 is a view illustrating the semiconductor device according to a third embodiment of the present invention. The semiconductor device 10 of this embodiment resembles the semiconductor device 10 of FIG. 1. In this embodiment, however, the bumps 14 are mainly made of copper formed by non-electrolytic plating, which is covered with a solder layer 21.

FIGS. 8A to 8F are views illustrating a method of producing the semiconductor device of FIG. 7. FIG. 8A illustrates a state where the substrate 11 is subjected to the semiconductor process to form the antenna pads 12 and the testing pad 13 and the test is carried out. There is formed a needle scar 17. The inorganic insulating film 15 has openings to expose the antenna pads 12 and the testing pad 13.

FIG. 8B illustrates a state where a pretreatment is effected to smooth the surface of the testing pad 13. As a result, the needle scar 17 dwindles. FIG. 8C is a view illustrating the formation of the insulating resin layer 16A containing a filler. The insulating resin layer 16A containing the filler covers the testing pad 13.

FIG. 8D is a view illustrating a state where the resist 20 of a predetermined pattern is formed on the surface of the substrate 11 having the insulating resin layer 16 containing the filler formed thereon and, besides, the bumps 14 are formed by non-electrolytically plating with copper by using the resist 20 as a mask. FIG. 8E is a view illustrating a state where the resist 20 is removed to finish the formation of bumps. FIG. 8F is a view illustrating the formation of the solder layer 21 covering the bump 14. In this case, the solder layer 21 may be formed as required. Further, the bump 14 may be formed using not only a copper layer but also a plurality of layers including those of other materials (e.g., Ni and Au).

Usually, the formation of the bump by the non-electrolytic plating is carried out by a Ni-plating. However, hydrogen which is produced during the non-electrolytic Ni-plating penetrates the passivation film and enters the ferroelectric layer, giving rise to the occurrence of a pinning phenomenon which makes it difficult to rewrite the data. In this embodiment, therefore, the bump 14 is formed by electrolytic plating with copper, which produces little hydrogen and eliminates the possibility that the data cannot be rewritten into the nonvolatile memory, at a low cost.

Figure 9A:
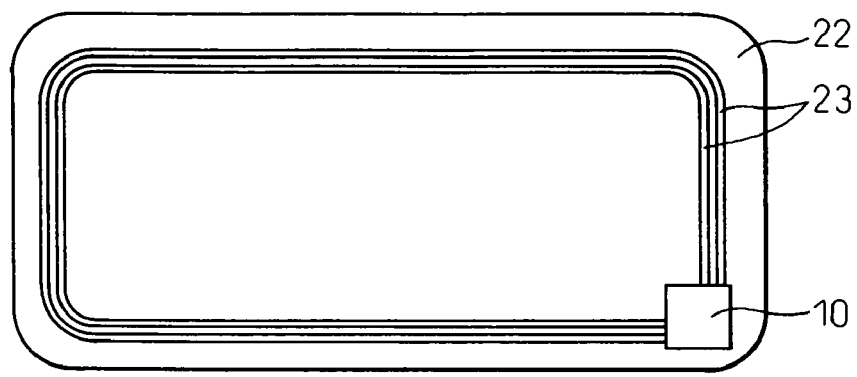
FIGS. 9A to 9C are views illustrating an IC tag including the semiconductor device of the present invention.
Figure 9B:
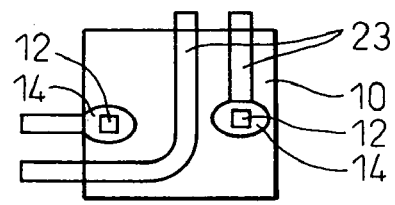
Figure 9C:
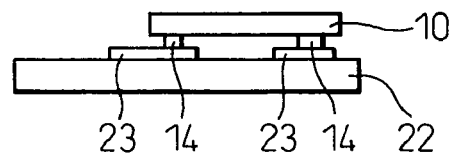
Figure 10:
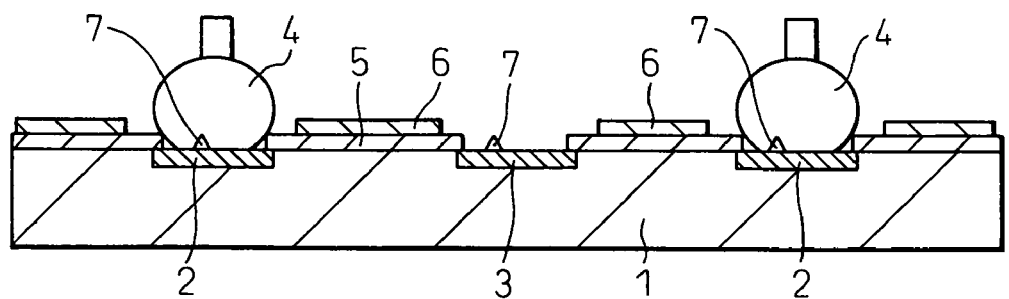
FIG. 10 is a sectional view illustrating a conventional semiconductor device.

FIGS. 9A to 9C are views illustrating an example of an IC tag including the semiconductor device of the present invention. FIG. 9A is a plan view illustrating an IC tag 22 to which the semiconductor device 10 is connected and secured. FIG. 9B is a view schematically illustrating a portion of the semiconductor device 10 together with an antenna circuit 23 of the IC tags 22. FIG. 9C is a side view illustrating the IC tag 22 to which the semiconductor device 10 is connected and secured. The semiconductor device 10 is connected and secured to the IC tag 22 through the bumps 14. The IC tag 22 has the antenna circuit 23, and the bumps of the semiconductor device 10 are connected to the antenna circuit 23 of the IC tag 22. In FIG. 9, the testing pad 13 is not illustrated. The data in the IC tag 22 are read out without contact by an apparatus body that is not shown.

According to the present invention, as described above, the specific data in the semiconductor device are inhibited from being read out or rewritten. Namely, the semiconductor device can be safely and reliably used as a nonvolatile memory.

The invention claimed is:

1. A semiconductor device comprising:
a substrate;
antenna pads formed on the substrate;
a testing pad formed on the substrate;
an insulating resin layer containing a filler covering the testing pad;
bumps provided on the antenna pads; and
wherein said insulating resin layer is thinner than said bumps.

2. The semiconductor device according to claim 1, wherein said insulating resin layer containing the filler contains a filler of silica or acrylic resin.

3. The semiconductor device according to claim 2, wherein said filler comprises particles having a size of 1 to 2 µm, and the insulating resin layer containing the filler has a thickness of 3 to 6 µm.

4. The semiconductor device according to claim 1, wherein said bump is made of Al, Cu, Ni or Au.

5. A method of producing a semiconductor device comprising the steps of:
forming antenna pads and a testing pad on a substrate;
covering a part of the substrate except for the antenna pads with an insulating resin layer containing a filler;
forming a seed layer for plating on the antenna pads and the insulating resin layer containing the filler; and
plating the seed layer for plating to form bumps on the antenna pads.

6. The method of producing a semiconductor device according to claim 5, further comprising the step of smoothing the surface of the testing pad before the step of covering the substrate with the insulating resin layer containing the filler.

7. A method of producing a semiconductor device comprising the steps of:
forming antenna pads and a testing pad on a substrate;
covering a part of the substrate except for the antenna pads and the testing pad with an insulating resin layer containing a filler;
forming a seed layer for plating on the antenna pads, the testing pad and the insulating resin layer containing the filler;
plating the seed layer for plating to form bumps on the antenna pad; and
removing a part of the seed layer for plating except for the antenna pads, and the testing pad.

8. A method of producing a semiconductor device comprising the steps of:
forming antenna pads and a testing pad on a substrate;
covering a part of the substrate except for the antenna pads with an insulating resin layer containing a filler;
forming bumps on the antenna pads by non-electrolytic plating;
covering the surface of the bumps with a solder layer; and
wherein said insulating resin layer is thinner than said bumps.

9. The method of producing a semiconductor device according to claim 8, wherein the non-electrolytic plating uses copper.

* * * * *